United States Patent [19]
Lyshkow

[11] Patent Number: 5,431,953
[45] Date of Patent: Jul. 11, 1995

[54] AUTOMATED DEVICE FOR APPLYING EVAPORATOR BEADS TO A CONDUCTIVE WIRE

[75] Inventor: Norman Lyshkow, Chicago, Ill.

[73] Assignee: Hamamatsu Corporation, Bridgewater, N.J.

[21] Appl. No.: 881,671

[22] Filed: May 12, 1992

[51] Int. Cl.6 .......................... B05D 3/00; B05D 7/20; B05C 1/04

[52] U.S. Cl. .......................................... 427/8; 118/33; 118/68; 118/234; 118/241; 118/666; 118/672; 118/DIG. 2; 118/DIG. 22; 427/120; 427/123

[58] Field of Search ................ 118/33, 234, 420, 423, 118/428, 429, 666, 670, 695, 704, 706, 707, 712, DIG. 2, DIG. 22, 65, 68, 672, 210, 241, 243; 427/8, 74, 123, 125, 434.6, 117, 120, 318

[56] References Cited

U.S. PATENT DOCUMENTS

| | | | |
|---|---|---|---|
| 894,592 | 7/1908 | Callan | 118/68 |
| 1,031,620 | 7/1912 | Callan | 118/241 |
| 3,529,571 | 9/1970 | Good et al. | 118/68 |
| 3,886,894 | 6/1975 | Breckle | 118/676 |
| 4,357,368 | 11/1982 | Longsderff et al. | 427/74 |
| 5,127,364 | 7/1992 | Savkar et al. | 118/712 |

FOREIGN PATENT DOCUMENTS 54-148859  11/1979  Japan ................................ 427/120

*Primary Examiner*—Joseph W. Drodge
*Attorney, Agent, or Firm*—Rockey, Rifkin and Rythe

[57] ABSTRACT

A length of conductive wire is supported between a first reel and a second reel. The first reel is driven to move the wire through the device in a stepped fashion. Each time the wire stops a reciprocating plunger brings a material to be evaporated into contact with the wire. An electric current is passed through the length of wire in the area where the material contacts the wire. The wire is heated by the electric current to melt the material onto the wire to form a bead of material thereon. The wire is advanced to repeat the bead forming process. The wire with the beads formed thereon is wound onto the first reel for later use in an evaporator process. An infrared sensor monitors the heating process to determine if the material is melted at the desired temperature. A sensor is also provided to stop the device if the wire breaks. The advancing of the wire, the operation and refilling of the plunger and the heating of the wire are all performed automatically.

38 Claims, 7 Drawing Sheets

Fig. 1
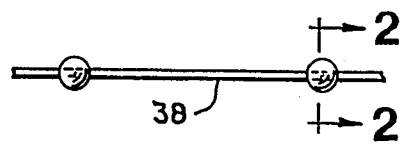
Fig. 2
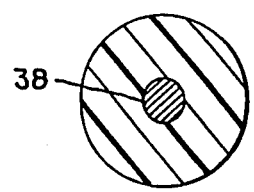
Fig. 3

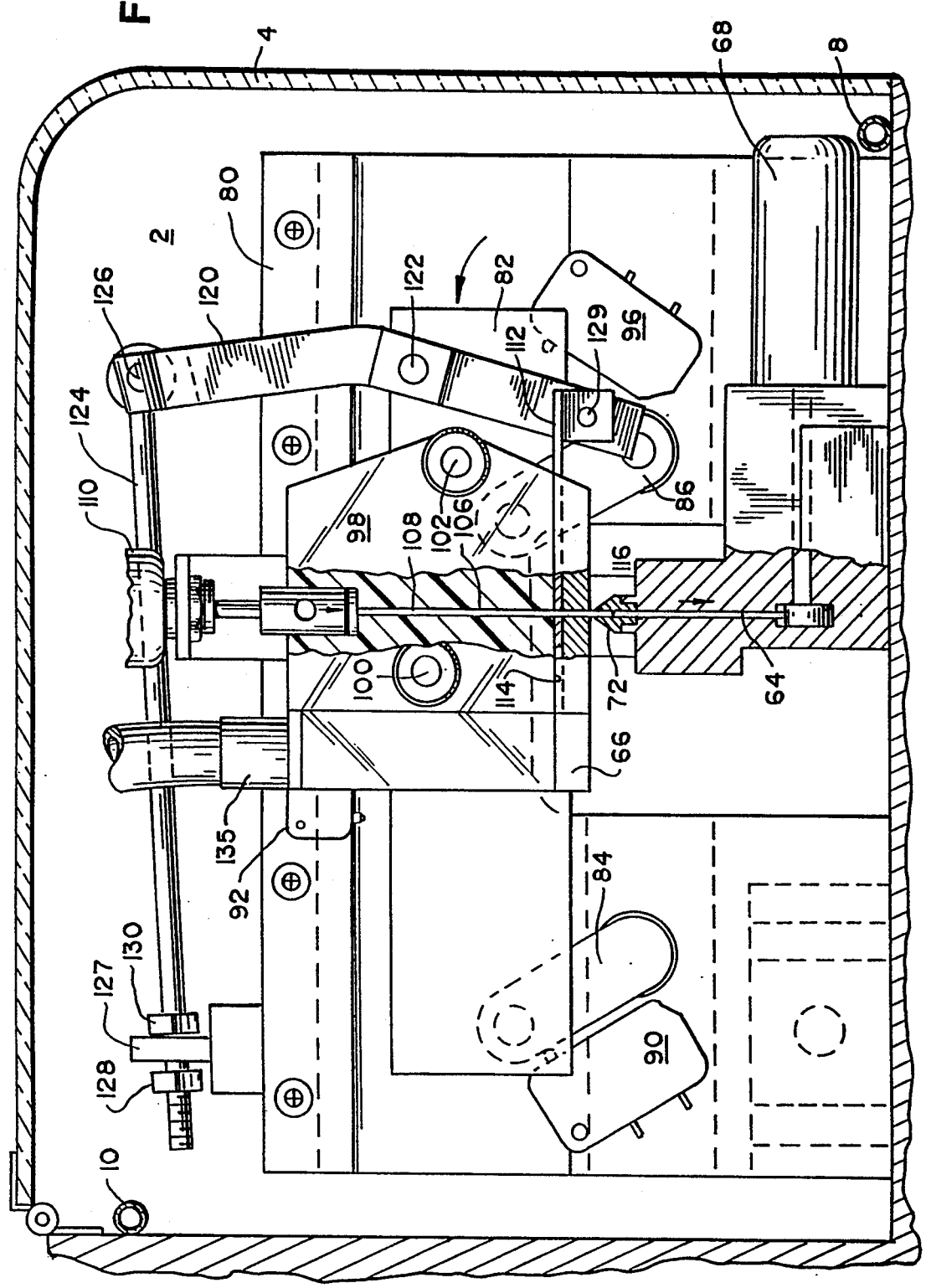

5,431,953

AUTOMATED DEVICE FOR APPLYING EVAPORATOR BEADS TO A CONDUCTIVE WIRE

BACKGROUND OF THE INVENTION

The invention relates, generally, to an automated machine for applying evaporator beads to a conductive wire.

Evaporator beads typically consist of antimony, manganese or other metals formed on metal wires. For example, where the bead is formed of antimony the wire is platinum coated molybdenum and where the bead is manganese the wire is tungsten. Other metals for the bead and wire can be used as desired. An example of such evaporator beads is shown in U.S. Pat. No. 4,357,368 to Longsdorff et al. To use the evaporator beads, the wire carrying the beads is located closely adjacent to a substrate to be coated. For example, the wire can extend through a photocathode. An electrical current is passed through the wire thereby heating the wire and vaporizing the evaporator bead. The vapor generated by the evaporating bead is deposited on a surface such as glass to create a layer or coating thereon.

While the use of such evaporator beads has proven to be an excellent method for coating surfaces such as photomultiplier cathodes, semiconductor surfaces and optical mirrors, the existing methods for forming the evaporator beads on the wire are inefficient. Presently, preformed beads, manufactured by processes such as that shown in Longsdorff et al., are applied to the wire by hand. This process is relatively slow and labor intensive. As a result, evaporator bead wire is extremely expensive. Moreover, the manual process results in significant waste of wire and bead material. And, the beads formed on the wire are not uniform in size and shape.

Thus, an automated method and apparatus for forming evaporator beads on conductive wire cheaply and efficiently is desired.

SUMMARY OF THE INVENTION

The automated apparatus of the invention overcomes the above-noted shortcomings of the prior art by manufacturing evaporator wire approximately ten times more cheaply than the manual process with less waste and higher quality. The apparatus consists of an intermittently driven reel that advances wire through the apparatus in a step manner. A predetermined quantity of evaporator material such as metal powder is automatically brought into contact with the wire by a reciprocating plunger. Current is passed through the wire to heat the wire thereby causing the quantity of metal powder to melt and form a bead on the wire. Once the bead is formed, the wire is advanced and the plunger is refilled with the powdered metal.

BRIEF DESCRIPTION OF THE DRAWINGS

FIG. 1 is a detailed view of evaporator wire having beads formed thereon.

FIG. 2 is a section view along line 2—2 of FIG. 1.

FIG. 3 is a perspective view of the apparatus of the invention with various components removed for illustrative purposes.

FIGS. 5 and 6 are detailed views of apparatus of the invention.

DETAILED DESCRIPTION OF THE INVENTION

Figure 4:
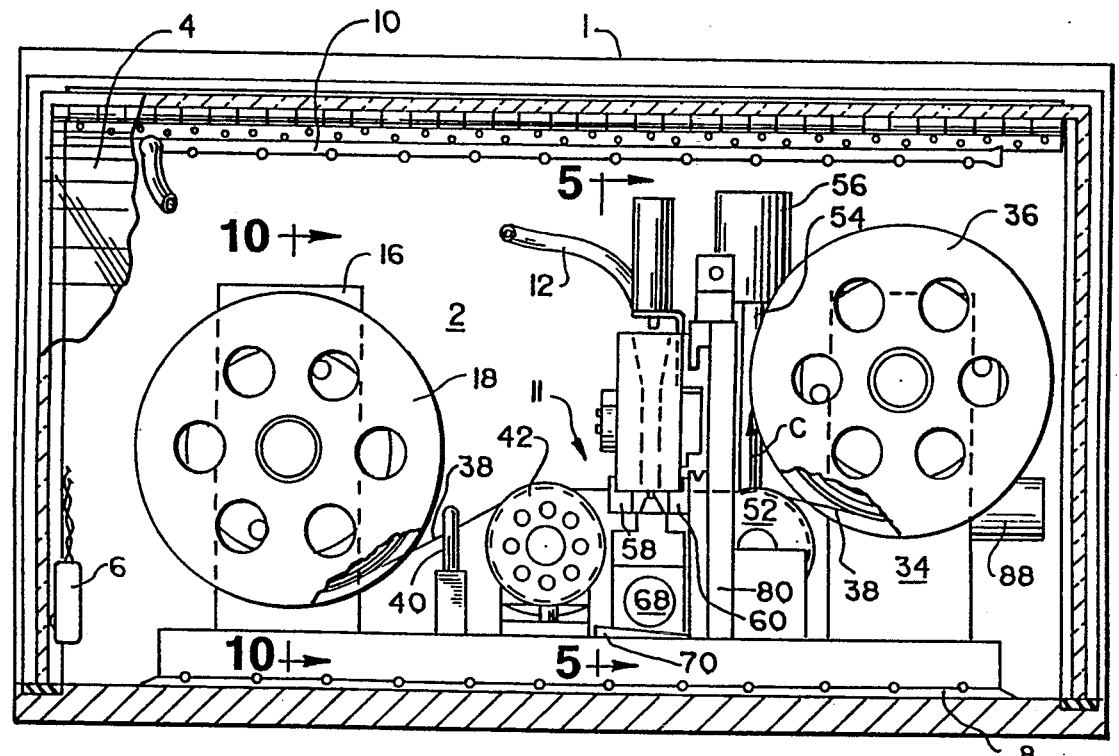
FIG. 4 is a front view of the apparatus of the invention.

Referring more particularly to FIGS. 3, 4 and 5, the automated apparatus of the invention consists of a cabinet 1, containing the electronic circuitry and microprocessor for controlling operation of the device. Cabinet 1 partially defines a chamber 2 that is enclosed by transparent hood 4. Hood 4 and housing 1 form an airtight seal such that chamber 2 is isolated from the external environment. A sensor 6 is provided to prevent operation of the device if the hood 4 is not properly sealed against cabinet 1.

Gas inlet ports 8 and gas outlet ports 10 are located at the lower front and upper rear of chamber 2, respectively. An inert gas is delivered to chamber 2 via port 8 and evacuated from chamber 2 via port 10 such that the bead formation process will take place in an inert environment. Preferably, a two minute purge cycle is used prior to the start of the bead forming operation to ensure that oxygen is removed from chamber 2 and replaced with inert gas. Inert gas can be intermittently or continuously delivered to the chamber as needed during the bead forming process to maintain the inert atmosphere. Moreover, a pressure sensor can be provided in chamber 2 to prevent operation of the device if the chamber is not properly pressurized with inert gas.

A hose 12 is also provided that terminates at the bead forming station 14. Hose 12 delivers a stream of inert gas to this site to maintain an inert gas atmosphere surrounding the bead formation site. Moreover, the gas can be delivered from hose 12 in short bursts at predetermined intervals to cool the formed bead prior to advancing the wire.

Figure 10:
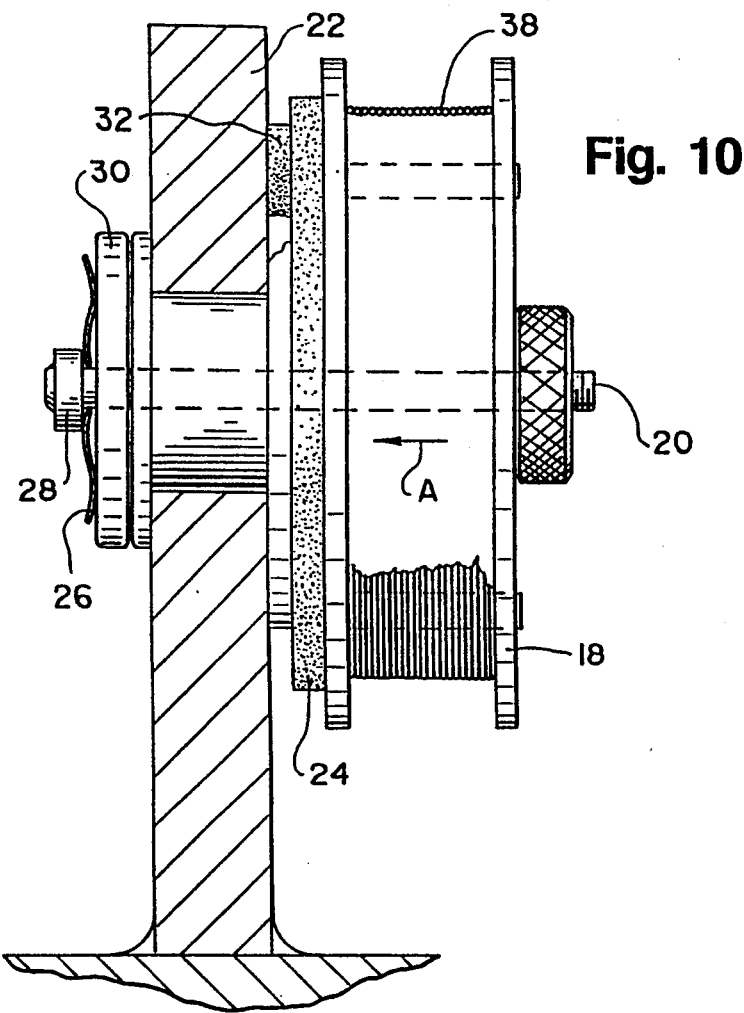
FIG. 10 is a detailed view of one of the reels for supporting the wire.

The apparatus for moving the wire past the bead forming station 14 will be described with reference to FIGS. 3 and 4. The apparatus includes a first reel support 16 for supporting a reel of untreated wire 18 onto which the beads are to be formed. As best shown in FIG. 10, axle 20 is rotably supported in plate 22 and extends from the back of the plate a predetermined distance. A friction disc 24 is supported on axle 20 between reel 18 and plate 22. A compression spring 26 is located between bushings 30 and flange 28 formed on the end of axle 20. Compression spring 26 pulls reel 18 toward plate 22 in the direction of arrow A such that friction disk 24 slidably contacts bumpers 32. Because of the friction between disk 24 and bumpers 32, the wire 38 will be advanced under tension as reel 18 is unwound.

Referring again to FIGS. 3 and 4, a take-up reel support 34 is located at the opposite side of bead forming station 14 from reel 18 and supports a take-up reel 36. A stepper motor 33 intermittently drives take-up reel 36 to advance wire 38 in a step fashion past the bead forming station 14 and wind the wire on reel 36. The distance the wire is advanced can be adjusted by a potentiometer to control the number of steps in each movement cycle.

Figure 11:
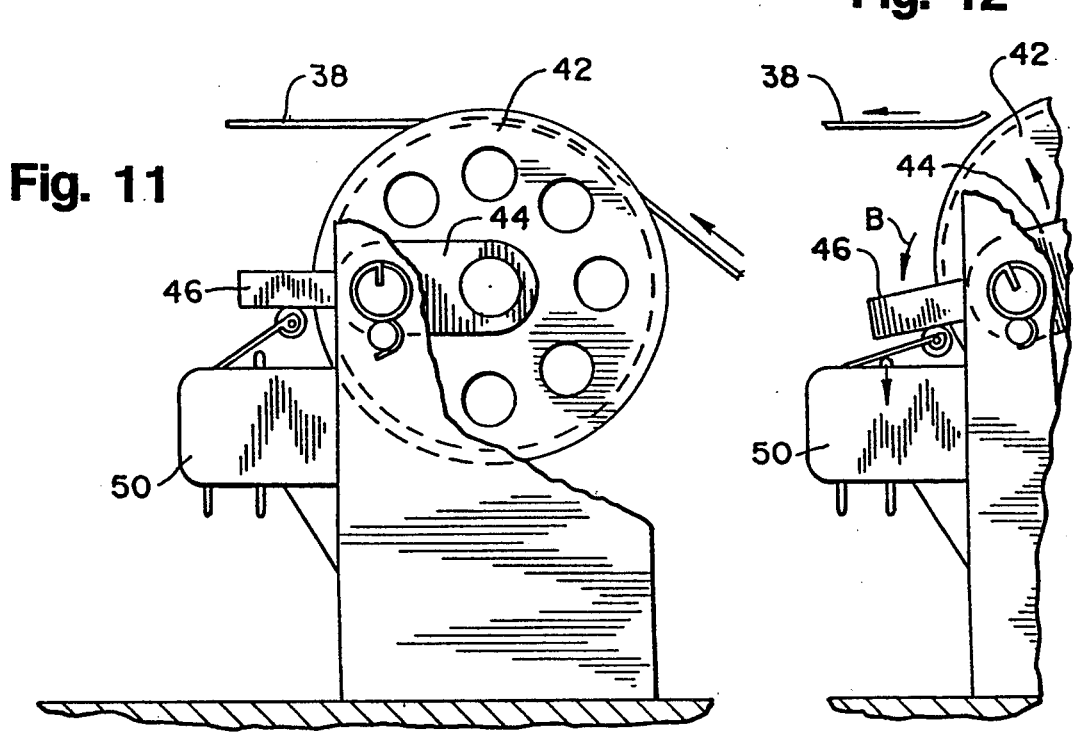
FIGS. 11 and 12 are detailed views of one of the pulleys of the invention.
Figure 12:
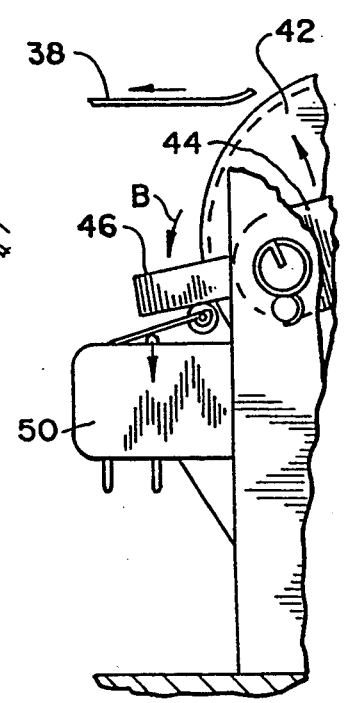

The wire 38 passes through guides 40, which limit movement of the wire in the horizontal direction, and is threaded over a first pulley 42. Pulley 42 is supported on pivoting arm 44 and is biased in an upward direction by counterweight 46 as best shown in FIGS. 11 and 12. Pulley 42 is forced down against the counterweight by the force from wire 38. Thus, if the wire should break as illustrated in FIG. 12, the pulley 42 will be moved upwardly as counterweight 46 pivots arm 44 about pivot 48 in the direction of arrow B. Switch 50 is located such that it will be closed by the counterweight 46 as arm 44 is pivoted. Switch 50, when it is closed, signals the microprocessor to stop the device. Thus, pulley 42 and switch 50 act as a sensor to stop the device in the event that the wire breaks.

Referring to FIG. 4, a second pulley 52, located between the bead forming station 14 and take-up reel 36, also has wire 38 threaded over it. Pulley 52 is pivotably mounted on the plunger 54 of solenoid 56 such that each time wire 38 is advanced through the bead forming station 14 by reel 36, solenoid 56 is activated to raise pulley 52 as represented by arrow C. Pulley 52 is raised to allow the newly formed beads to be advanced through the bead forming station without the beads striking any of the components, as will hereinafter be described.

Figure 7:
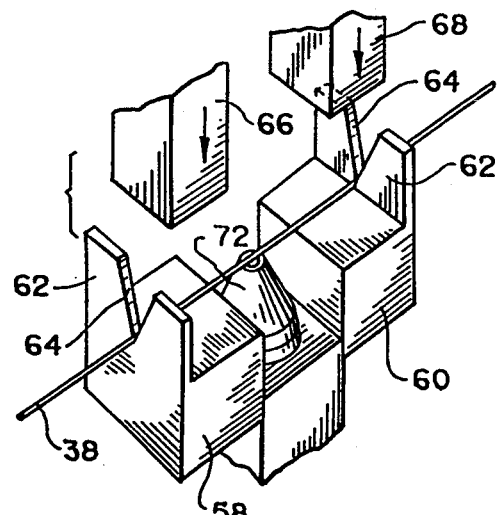
FIGS. 7, 8 and 9 are detailed views of the bead forming station of the invention.
Figure 8:
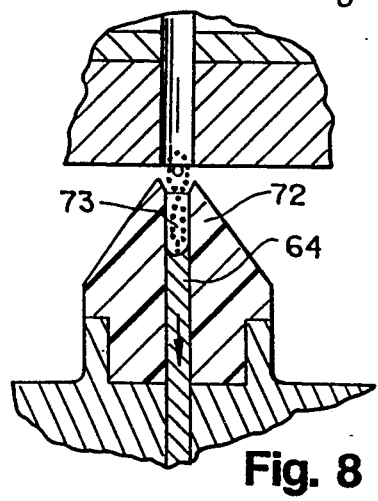
Figure 14:
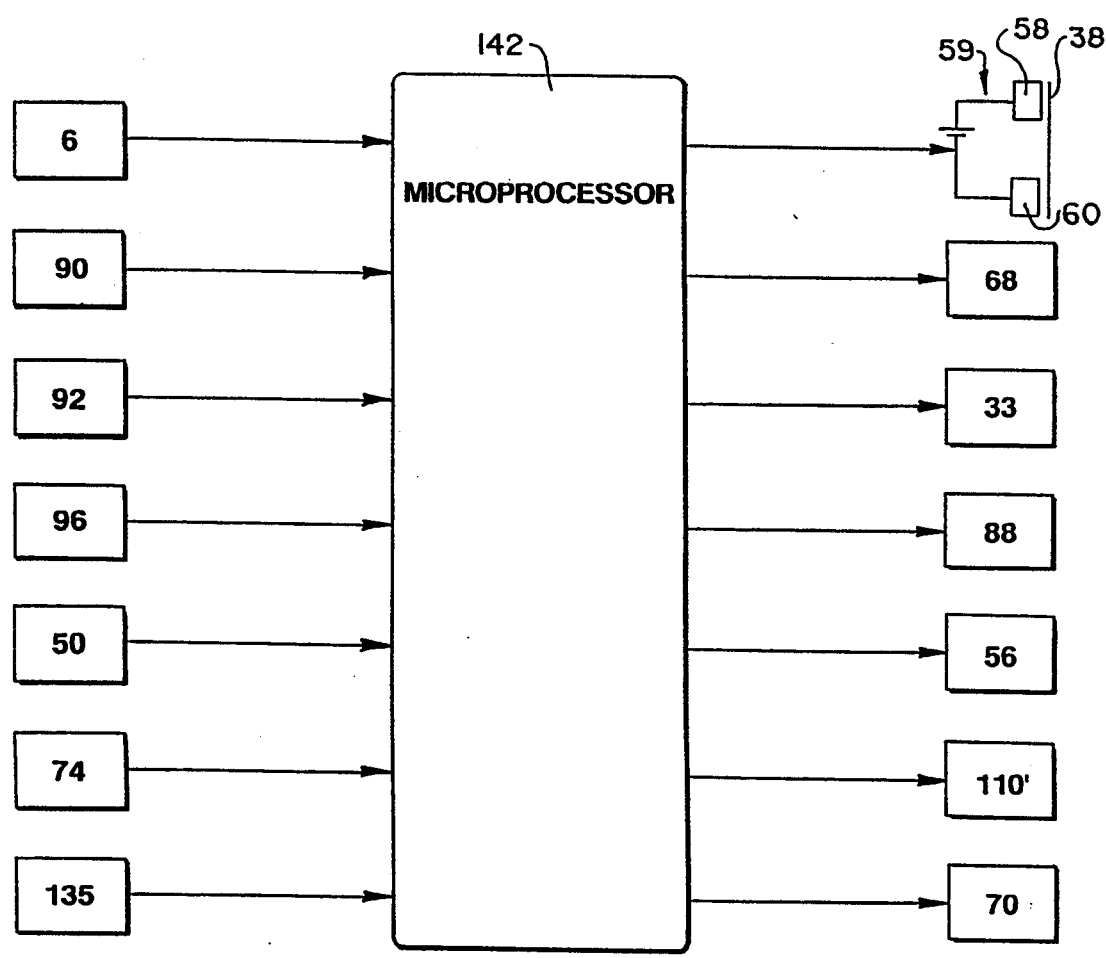
FIG. 14 is a schematic view of the control system for the apparatus of the invention.

The bead forming station 14 is shown in FIGS. 3, 4, 7, 8 and 9 and consists of a pair of electrically conductive conductor guides 58 and 60 disposed in the path of travel of wire 38. As best shown in FIG. 7, the conductor guides include vertical flanges 62 that define V-shaped grooves 64 in which the wire 38 rides. Wire contacting elements 66 and 68 are mounted to carrier plate 82 to be moved into contact with the wire during the bead forming operation (FIGS. 5 and 7) to force the wire into engagement with the conductor guides 58 and 60 and ensure that an electrical path is provided between guides 58 and 60 and the wire. The conductor guides 58 and 60 are connected to a source of electrical power such that when the power source is turned on and the wire contacts both conductor guides, a circuit 59 will be created including the length of wire spanning the conductor guides as shown schematically in FIG. 14. The current flowing through the length of wire between the conductor guides 58 and 60 will heat the wire such that the evaporator bead can be melted thereon, as will be described.

Referring to FIGS. 4 and 7, when the wire having the evaporator bead formed thereon is advanced, pulley 52 will be raised by solenoid 56 as previously described. This movement elevates the wire such that the newly formed bead will clear the V-shape groove 64 of conductor guide 60.

The mechanism for bringing the evaporator material such as powdered metal into contact with the heated wire will now be described with reference to FIGS. 3, 4, 6, 8 and 9. The bead applicator 62 is located below wire 38 and between conductor guides 58 and 60. Bead applicator 62 consists of a plunger 64 supported on an eccentric 66 such that as eccentric 66 is rotated by motor 68, plunger 64 will be reciprocated up and down. The bead applicator unit is removable and is supported on an inclined ramp 70. By adjusting the position of the bead applicator on ramp 70 the distance between bead applicator unit and the wire can be adjusted.

Figure 9:
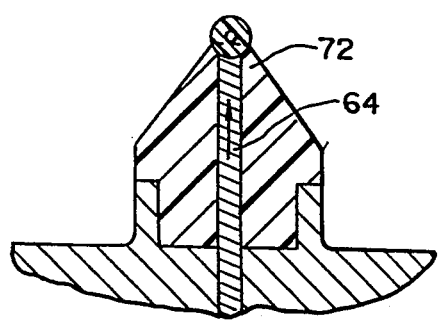

Plunger 64 is disposed below a stationary cup 72 which holds a quantity of powdered metal 73. The powdered metal is moved from the cup into contact with the wire 38 as the plunger 64 is reciprocated. The movement of plunger 64 is timed such that when the plunger is in its lowermost position the cup 72 can be refilled with powdered metal as will herein after be described. A switch 74 is provided to indicate when plunger 64 is in its lowermost position. When plunger 64 is moved to uppermost position, it will extend through aperture 76 formed in the bottom of cup 72 to bring the powdered metal against wire 38 as best shown in FIG. 9. Plunger 64 is reciprocated to repeatedly bring the powdered metal into contact with the heated wire so that the powdered metal is uniformly melted on wire.

The mechanism for refilling the bead applicator will now be described with reference to FIGS. 3 through 6 and 13. The mechanism includes a support 80 arranged substantially perpendicularly to the direction of travel of the wire. Support 80 supports carrier plate 82 via parallel links 84 and 86 such that the parallel linkage created by plate 82, support 80, and links 84 and 86 will move carrier plate 82 in a substantially inverted U-shaped motion. Reversible motor 88 drives link 84 to move carrier plate 82 between three positions.

Figure 6:
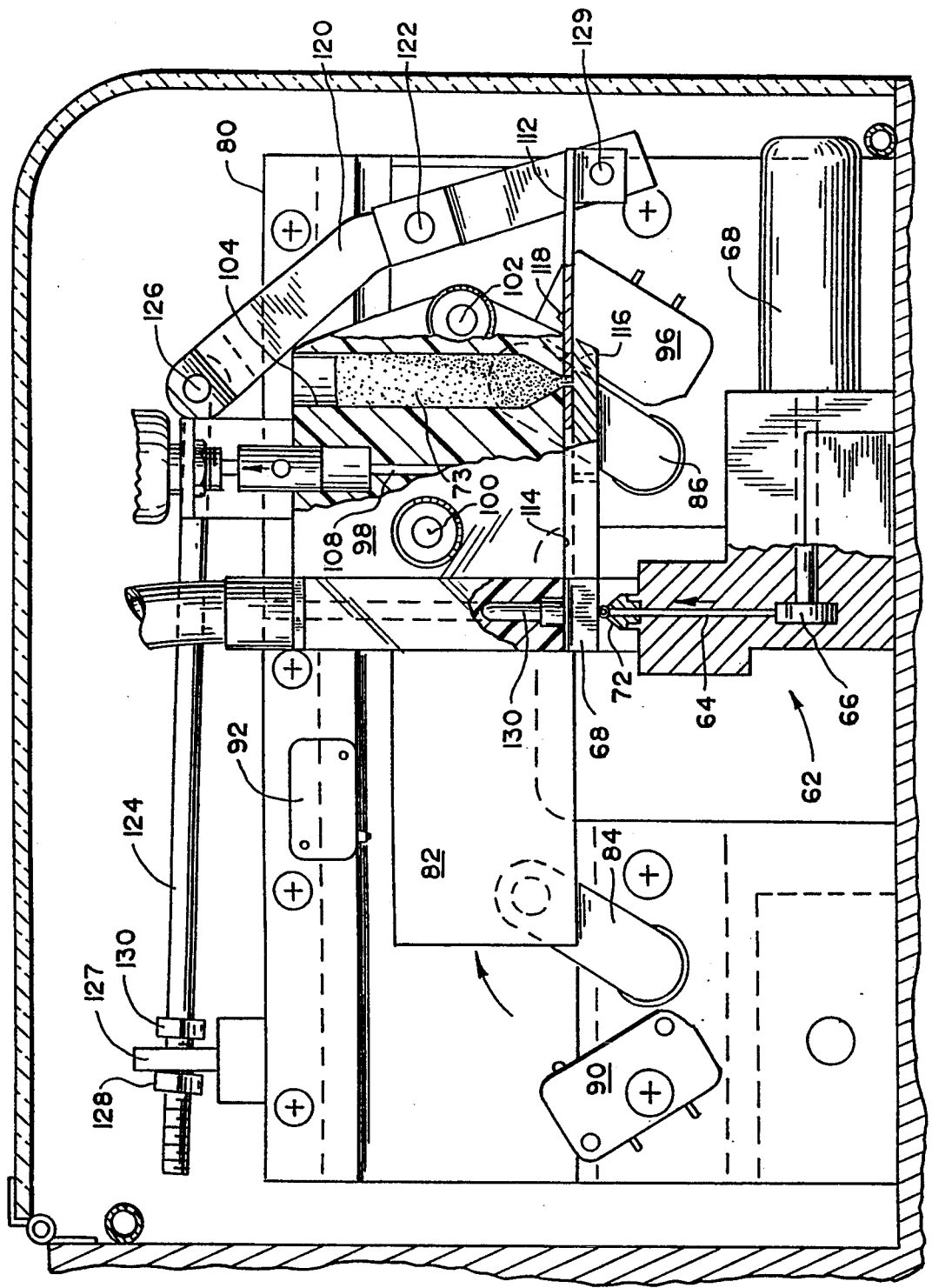

Switches 90, 92 and 96 are associated with each of the three positions to signal microprocessor that carrier plate 82 is in the desired position such that motor 88 can be deactivated. In the first position carrier plate 82 is moved to the rear of the chamber 2 where cup 72 is refilled with powdered metal as shown in FIG. 5. In the second position, carrier plate 82 is moved to the front of chamber 2 while the wire is heated and the bead is applied as shown in FIG. 6. In the third position, carrier plate 82 is located between the first and second positions as wire 38 is advanced. The sequence of operation will hereinafter be explained in greater detail.

Figure 13:
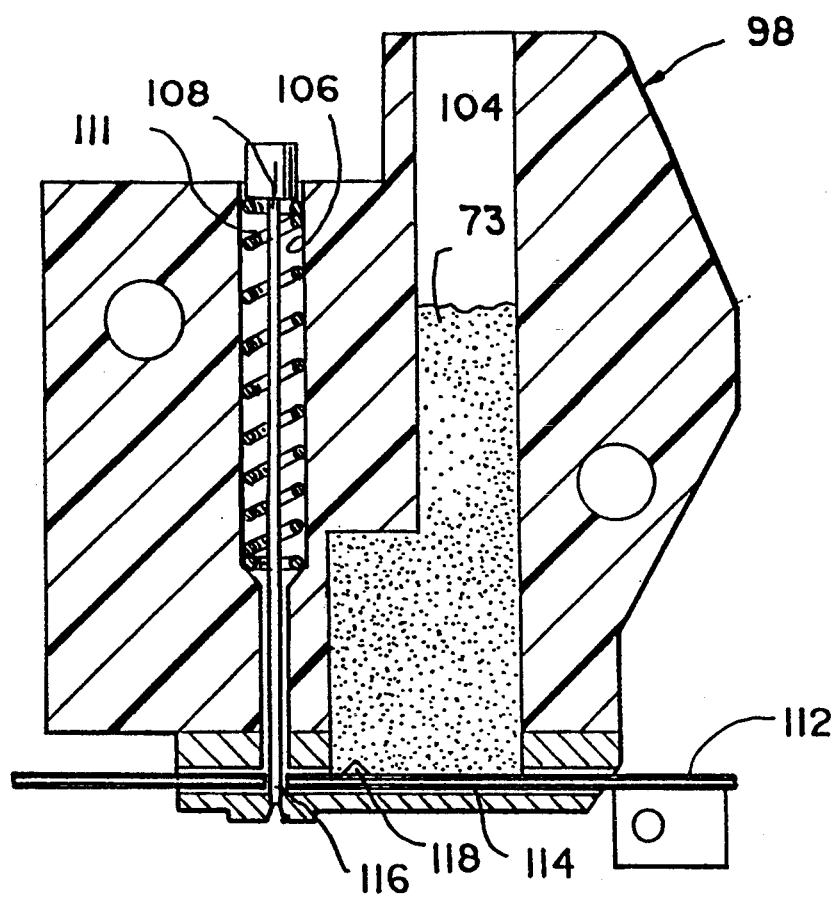
FIG. 13 is a detailed view of the apparatus for refilling the metal powder.

A machined plastic housing 98 for retaining a supply of powdered metal is releasably secured to carrier plate 82 by bolts 100 and 102 as best shown in FIGS. 3, 5, 6 and 13. A different housing 98 can be installed in the apparatus where different powdered metals are being applied or different sized beads are required. Housing 98 includes a relatively large first chamber 104 for retaining a supply of powdered metal 73. A second chamber 106 is disposed vertically in housing 98 adjacent the first chamber and retains a vertically reciprocating plunger 108. Plunger 108 is moved down by solenoid 110 that is mounted on carrier plate 82 and is moved up by compression spring 111. A slide 112 is mounted in horizontal passage 114 that is disposed below and communicates with both chambers 104 and 106. Slide 112 includes a small aperture 116 for receiving a quantity of powdered metal 73 and a raised vane 118 for facilitating the flow of the powdered metal from chamber 104 into aperture 116. Vane 118 mixes the powdered metal as the slide moves through chamber 104 to maintain constant bulk density of the powdered metal. In operation, slide 112 is reciprocated between a first position where aperture 116 is disposed below the first chamber 104 and is filled with a quantity of powdered metal and a second position where it is disposed below plunger 108 as shown in FIG. 13. Plunger 108 is dimensioned such that it will pass through aperture 112 upon activation of solenoid 110.

A lever arm 120 is pivotably connected to carrier plate 82 at a midpoint 122 and has its first end pivoted to stop 124 at pivot 126. The opposite end of stop 124 is slidably retained in sleeve 127 where movement of stop 124 in sleeve 127 is limited by adjustable collars 128 and 130. As carrier plate 82 reciprocates, stop 124 will limit the movement of the first end of lever arm 120 causing lever arm 120 to pivot about point 122. Thus, the activation of motor 88 will not only move plate 82 but will also cause lever arm 120 to pivot between first and second positions about midpoint 122. The opposite end of lever arm 120 is pivotably connected to one end of slide 112 at pivot point 129 such that the pivoting of lever arm 120 causes slide 112 to reciprocate between its first and second positions. The lever arm 120 and stop 124 are configured such that when plate 82 is positioned with plunger 108 over cup 72, aperture 116 will be positioned below plunger 108. Thus, when plunger 108 is extended it will pass through aperture 116 to force powdered metal out of the aperture and into cup 72. When the parallel linkage moves plate 82 to the position shown in FIG. 6, aperture 116 will be positioned below the first chamber 104 such that powdered metal will fill the aperture under the force of gravity.

Also mounted on carrier plate 82 is an infrared fiber optic detector 130. Fiber optic detector 130 is positioned on carrier plate 82 such that it will be disposed over wire 38 when the wire is heated and the carrier plate is in the position shown in FIG. 6. The fiber optic detector transmits a signal indicative of the heat of wire 38 to an IC circuit. The IC circuit can control the current delivered to wire 38 to thereby control the heat of the wire in response to the signal received from detector 130. A mechanical chopper 70 is provided to chop the light from detector 130.

The operation of the device will now be described. Reel 36 is rotated by stepper motor 33 to advance an untreated length of wire between conductor guides 58 and 60 as carrier plate 82 rests in its intermediate position between the positions illustrated in FIGS. 5 and 6. Once reel 36 stops, links 84 and 86 move carrier plate 82 from its intermediate position to the position shown in FIG. 5 where plunger 108 is disposed over wire 38. Cup 72 is empty and plunger 64 is in its lowermost position. Solenoid 110 is then activated such that plunger 108 is extended through aperture 116 to force the evaporator material from aperture 116 into cup 72. Plunger 108 is retracted by spring 111. Carrier plate 82 is then moved to the position shown in FIG. 6 by links 84 and 86 where members 66 and 68 force wire 38 against conductor guides 58 and 60. Simultaneously, slide 112 is retracted to a position below chamber 104 by arm 120 where it is refilled with evaporator material. As the housing is moved to the position of FIG. 6, plunger 64 is reciprocated between its lowermost and uppermost positions by motor 68 and current is passed through wire 38 via conductor guides 58 and 60. The evaporator material pushed from cup 72 by plunger 64 is melted onto wire 38 to form the evaporator bead. Fiber optics sensor 130 monitors the heat of the bead forming process and the current passing through wire 38 is adjusted accordingly.

Once the sensor circuit associated with fiber optic sensor 130 detects that a threshold energy has been reached based on the size of the bead, the microprocessor is signaled that the bead is formed. Members 66 and 68 release wire 38 as carrier plate 82 is moved to its intermediate position and pulley 52 is moved to its elevated position by solenoid 56 to ensure that the newly formed bead clears conductor guide 62. A pulse of inert gas is delivered from hose 12 to cool the bead prior to the wire being advanced. Plunger 64 retracts from cup 72 and reel 36 advances another length of wire between conductor guides 58 and 60 such that the process can be repeated.

Referring more particularly to FIG. 13, a schematic drawing showing the control system of the invention is shown. A microprocessor 142 receives signals from the various switches and sensors indicating the position of the various components and the temperature of the heated wire. The microprocessor, in response to these signals, controls the various motors and the current delivered to the wire via circuit 59 to coordinate the movement of these components. Suitable controls on the machine cabinet can be used to control the microprocessor to vary the cycling speed, increase or decrease the distance between beads, and increase or decrease the heat generated in the wire such that evaporator beads can be formed of a variety of materials on different types of wire. Moreover, the housing can be provided with visual readouts providing information relating to the bead forming process such as the number of cycles performed and the current being passed through the wire.

While the invention has been described in some detail with reference to the figures, numerous changes in the details and construction of the device can be made without departing from the spirit and scope of the invention.

What is claimed is:

1. A device for automatically forming evaporator beads on a wire, the evaporator beads being formed from a material that is to be evaporated during an evaporator process, comprising:
    a) first means for advancing a length of wire;
    b) second means for heating the wire;
    c) third means for bringing material into contact with said wire when it is heated, said third means including a reciprocating plunger for moving the material into contact with said wire, said plunger communicating with a cup for retaining a quantity of the material; and
    d) means for controlling the first, second and third means.

2. The device of claim 1, further including fourth means for refilling the third means with material.

3. The device of claim 2, wherein the fourth means includes a reciprocating plunger for delivering the material to said third means.

4. The device of claim 1, wherein said first means includes a first reel for advancing the wire, means for intermittently driving said first reel and a second reel, said second reel including means for maintaining tension on the wire.

5. The device of claim 1, further including means for sensing a break in the wire.

6. The device of claim 1, wherein said second means includes a first electrically conductive element contacting said wire and a second electrically conductive element spaced from said first electrically conductive element contacting said wire such that an electrical circuit is created including a length of wire between said first and second electronically conductive elements, and means for applying current to said circuit to heat said length of wire.

7. The device of claim 6, further including means for ensuring contact between said wire and said first and second electrically conductive elements.

8. The device of claim 7, wherein said means for ensuring contact comprises members for selectively trapping the wire against said first and second electrically conductive elements.

9. The device of claim 1, further including means for monitoring the heating of the wire and for providing a signal indicative of the temperature of the wire.

10. An apparatus for automatically forming evaporator beads on a wire from a material, comprising:
   a) first means for intermittently advancing an electrically conductive wire;
   b) second means for applying an electrical current to said wire to heat the wire;
   c) third means for bringing evaporator material into contact with the heated wire to melt the evaporator material and form a beads of material on the wire;
   d) means for controlling the first, second and third means; and
   e) means for sensing a break of the wire and for interrupting operation of the first second and third means in response to a signal generated by said means for sensing.

11. The apparatus according to claim 10, wherein the first means includes a first spool supporting a length of wire upstream of said second means and a second spool for winding the wire after the bead is formed on the wire and means for intermittently driving said second spool.

12. The apparatus according to claim 11, further including means for maintaining tension in the wire.

13. The apparatus according to claim 12, wherein said means for maintaining tension on the wire includes means for retarding the rotation of the first spool such that said means for intermittently driving the second spool works against a force.

14. The apparatus according to claim 11, wherein said means for intermittently driving the second spool includes a stepper motor.

15. The apparatus according to claim 10, wherein said wire is maintained under a tension and said means for sensing includes a pulley movable between a first position and a second position, said pulley being held in said first position by the tension on the wire and moving to said second position by a biasing means upon a break in the wire, and a switch for sensing movement of the pulley to the second position.

16. The apparatus according to claim 15, wherein said biasing means includes a counterweight.

17. The apparatus according to claim 10, wherein said second means includes two electrical conductors connected to an electrical power source, said wire contacting said conductors thereby to complete an electrical circuit.

18. The apparatus according to claim 17, further including means for holding the wire against said electrical conductors.

19. The apparatus according to claim 10 wherein said second means heats the wire to a temperature and further including means for generating a signal representative of the temperature of said wire, and means for controlling the current applied to the wire in response to said signal.

20. The apparatus according to claim 10 wherein said third means includes a reciprocating plunger and a cup, said plunger disposed below said wire, said plunger moving material from the cup to said wire.

21. The apparatus according to claim 20, wherein said plunger passes through a hole in said cup.

22. The apparatus according to claim 10, further including means for refilling said third means with evaporator material.

23. The apparatus according to claim 22, wherein said means for refilling including a supply of evaporator material and means for delivering some of the evaporator material from said supply to said third means.

24. The apparatus according to claim 23, wherein said means for delivering includes a reciprocating plunger, a slide member retaining the evaporator material movable between a first position below the supply of evaporator material and a second position below said plunger and a means for positioning said plunger over said third means when said slide member is in said second position.

25. A device for automatically forming evaporator bead wire, comprising:
   a) first means for advancing a wire comprised of a first material in a stepped manner;
   b) second means for heating the wire to a predetermined temperature;
   c) third means for delivering a second material from a location remote from the wire into contact with the heated wire to melt the second material and form a beads on the wire, said second material being different than the first material; and
   d) means for controlling the operation of the first, second and third means.

26. The device of claim 25, wherein said second material is powdered metal.

27. The device of claim 25, wherein said wire is electrically conductive and said second means includes means for applying electrical current to said wire.

28. The device of claim 25, wherein the first means includes a first spool supporting a length of the wire and second spool for winding the wire after the bead is formed on the wire and means for driving the second spool in a stepped fashion.

29. The device of claim 28, further including a means for retarding the motion of the first spool such that the means for driving works against a force to maintain a tension on the wire.

30. The device of claim 29, wherein the means for retarding includes a friction member slidably engaged with the first spool.

31. The device of claim 25, further including means for generating a signal representative of the temperature of the wire, and means for controlling the second means in response to said signal.

32. The device of claim 31, wherein said means for generating a signal includes an infrared detector.

33. The device of claim 25, further including a fourth means for refilling the third means with material.

34. The device of claim 33, wherein said third means includes a first reciprocating plunger for delivering the material from the location to the wire and the fourth means includes a second reciprocating plunger for delivering material from a material supply to the location.

35. The device of claim 33, wherein said third means includes a material supply, means for removing a portion of the material from the material supply and means for delivering said portion from said means for removing to third means.

36. The device of claim 35, wherein said material supply, means for removing and means for delivering are supported on a movable carrier plate.

37. A method of automatically making evaporator bead wire comprising the steps of:
 a) automatically advancing a predetermined length of wire and stopping the wire once the predetermined length has been advanced;
 b) automatically heating the wire to a predetermined temperature while it is stopped;
 c) automatically delivering material from a location remote from the wire into contact with the heated wire to melt the material so as to form beads on the wire;
 d) automatically delivering material from a material supply to the location; and
 e) automatically repeating steps a through d.

38. The method of claim 37, including the further step of sensing the temperature of the wire.

* * * * *